United States Patent [19]

Aoshima et al.

[11] Patent Number: 5,240,808
[45] Date of Patent: Aug. 31, 1993

[54] LIGHT-SENSITIVE COMPOSITIONS CONTAINING PHOTOSENSITIVE POLYMERIC COMPOUND HAVING BOTH PHOTOCROSS-LINKABLE GROUPS CAPABLE OF CYCLOADDITION, AND FUNCTIONAL GROUPS CARRYING P—OH BONDS

[75] Inventors: Keitaro Aoshima; Masanori Imai, both of Shizuoka, Japan

[73] Assignee: Fuji Photo Film Co., Ltd., Minami-Ashigara, Japan

[21] Appl. No.: 819,581

[22] Filed: Jan. 8, 1992

Related U.S. Application Data

[63] Continuation of Ser. No. 514,285, Apr. 25, 1990, abandoned.

[30] Foreign Application Priority Data

Apr. 27, 1989 [JP] Japan .................................. 1-108290

[51] Int. Cl.$^5$ .......................... G03F 7/021; G03C 1/60
[52] U.S. Cl. .................................... 430/175; 430/176; 430/281; 430/283; 430/284; 430/285; 430/927
[58] Field of Search ............... 430/175, 176, 281, 283, 430/284, 285, 927; 526/277, 278

[56] References Cited

U.S. PATENT DOCUMENTS

| | | | |
|---|---|---|---|
| 3,809,685 | 5/1974 | Sato | 526/277 |
| 4,001,150 | 1/1977 | Juna | 526/277 |
| 4,079,041 | 3/1978 | Baumann | 430/270 |
| 4,250,007 | 2/1981 | Yasuno | 526/277 |
| 4,259,117 | 3/1981 | Yamauchi | 526/277 |
| 4,274,933 | 6/1981 | Kamada | 526/277 |
| 4,297,470 | 10/1981 | Osada | 430/287 |
| 4,626,497 | 12/1986 | Roth et al. | 430/293 |
| 4,657,941 | 4/1987 | Blackwell | 526/277 |
| 4,687,727 | 8/1987 | Toyama | 430/281 |
| 4,738,870 | 4/1988 | Green | 526/278 |
| 5,061,592 | 10/1991 | Imai et al. | 430/283 |
| 5,171,655 | 12/1992 | Aoshima | 430/283 |

Primary Examiner—Charles L. Bowers, Jr.
Assistant Examiner—Christopher G. Young
Attorney, Agent, or Firm—Burns, Doane, Swecker & Mathis

[57] ABSTRACT

A light-sensitive composition which comprises at least one polymeric compound having both photocross-linkable groups and functional groups carrying P—OH bonds. The light-sensitive composition can effectively be employed for making lithographic printing plates, IC circuits and photomasks. The light-sensitive composition shows excellent practically acceptable developability with either of an aqueous alkali developer and an aqueous alkaline solution containing or free of organic substances such as organic solvents and/or surfacants. Moreover, when it is used to form PS plates, the resulting lithographic printing plates never cause background contamination and can provide a large number of good printed matters. The composition makes it possible to develop negative working PS plates with developers for positive working PS plates. Therefore, when both positive and negative working PS plates are processed, the use of the composition can save various troubles.

19 Claims, No Drawings

LIGHT-SENSITIVE COMPOSITIONS CONTAINING PHOTOSENSITIVE POLYMERIC COMPOUND HAVING BOTH PHOTOCROSS-LINKABLE GROUPS CAPABLE OF CYCLOADDITION, AND FUNCTIONAL GROUPS CARRYING P—OH BONDS

This application is a continuation of application Ser. No. 07/514,285, filed Apr. 25, 1990, now abandoned.

BACKGROUND OF THE INVENTION

The present invention relates to a light-sensitive composition which can be effectively used for making lithographic printing plates, IC circuits and photomasks and more specifically to a negative working light-sensitive composition which comprises a polymeric compound highly soluble in an aqueous alkaline developer.

There have been well known photocross-linkable materials capable of cross-linking through a cyclization-addition reaction and these compounds have widely been used as a principal component of a light-sensitive composition for use in making lithographic printing plates or the like. As such photocross-linkable polymeric compounds, useful are those having maleimido groups on the side chains and those having cinnamyl, cinnamylidene and/or chalcone groups, which have photodimerizable unsaturated double bonds adjacent aromatic nuclei, on the side chains or in the main chain.

Negative working presensitized plates for use in making lithographic printing plates (hereunder referred to as "negative working PS plates") or the like are roughly divided into two groups, one of which is alkali-developable type one whose un-exposed portions are removed by (or developed with) an aqueous alkali developer and the other of which is solvent-developable type one whose un-exposed portions are removed by (or developed with) an organic solvent type developer. From the viewpoint of safety and hygiene in work operations, the alkali-developable PS plates are favorable. Whether a PS plate is alkali-developable or solvent-developable is mainly determined depending on the properties of the photocross-linkable polymeric compound used.

There have been known various methods for making a photocross-linkable polymeric compound alkali-soluble. For instance, Japanese Patent Un-examined Publication (hereunder referred to as "J.P. KOKAI") No. Sho 52-988 (U.S. Pat. No. 4,079,041) and Japanese Patent Publication for Opposition Purpose (hereunder referred to as "J.P. KOKOKU") No. Sho 49-28122 (U.S. Pat. No. 4,297,470) disclose methods which comprise copolymerizing a low molecular weight compound having a photocross-linkable group and a polymerizable unsaturated bond with methacrylic acid or acrylic acid to form such an alkali-soluble polymeric compound; J.P. KOKOKU No. Sho 57-56485 discloses a method which comprises copolymerizing a low molecular weight compound having a photocross-linkable group and a polymerizable unsaturated bond with maleic acid anhydride and then hydrolyzing the resulting copolymer; J.P. KOKAI No. Sho 59-218440 discloses a method which comprises forming carboxylic groups on a polymeric compound comprising carboxylic acid anhydride units while introducing photocross-linkable groups therein through a polymer reaction; J.P. KOKAI No. Sho 48-74594 discloses a method comprising introducing photocross-linkable groups into a polyacrylic acid through a polymer reaction; J.P. KOKAI No. Sho 60-191244 (U.S. Pat. No. 4,640,887) discloses a method which comprises reacting a polyester prepolymer having photodimerizable unsaturated double bonds adjacent to aromatic nuclei in the main chain, carboxyl groups on the side chains and hydroxyl groups on the termini with a chain-lengthening agent having at least two functional groups capable of reacting with hydroxyl groups such as diisocyanate compounds, diphenyl terephthalate, diphenyl carbonate or terephthaloylbis(N-caprolactam); and further there have been proposed a method of comprising reacting a polyester prepolymer or an urethane prepolymer having photodimerizable unsaturated double bonds adjacent to aromatic nuclei in the main chain and hydroxyl groups on the termini with a chain-lengthening agent such as pyromellitic dianhydride or cyclopentanetetracarboxylic acid dianhydride to introduce carboxyl groups in the side chains.

On the other hand, as aqueous alkaline developer compositions which are used to develop exposed negative working PS plates, there may be mentioned, for instance, those comprising benzyl alcohol, an anionic surfactant, an alkaline agent and water as disclosed in J.P. KOKAI No. Sho 51-77401; those consisting of an aqueous solution containing benzyl alcohol, an anionic surfactant and a water-soluble sulfite as disclosed in J.P. KOKAI No. Sho 53-44202 (U.S. Pat. No. 4,186,006); and those comprising an organic solvent of which solubility in water is not more than 10% by weight at ordinary temperature, an alkaline agent and water as disclosed in J.P. KOKAI No. Sho 55-155355.

All of these conventional developer compositions comprise organic compounds such as organic solvents and/or surfactants. However, organic solvents suffer from various drawbacks, for instance, these organic compounds being in general toxic, giving out bad smell, possibly becoming a cause of a fire, the waste liquor thereof being greatly inhibited by the BOD regulation and too much expences being required. On the other hand, the surfactants cause foaming during development operations. For this reason, it is desirable that developer compositions substantially free of these organic substances be employed.

Under such circumstances, there have been proposed a variety of developer compositions substantially free of organic substances such as those disclosed in J.P. KOKAI No. Sho 59-84241 (U.S. Pat. No. 4,500,625). These developer compositions are intended to be used for developing positive working PS plates which comprise an o-naphthoquinonediazide compound as a light-sensitive compound and they cannot develop negative working PS plates satisfactory (i.e., even after development, part of layers to be removed remains unremoved). In other words, they do not show acceptable developability. Moreover, even if they exhibit apparently acceptable ability to develop negative working PS plates, the resulting lithographic printing plate causes contamination of non-image areas thereof (i.e., background contamination) during printing.

The term "substantially free of organic substances" herein used means that the developer composition comprises not more than 3% by weight and preferably not more than 1% by weight of such organic substances.

SUMMARY OF THE INVENTION

Accordingly, an object of the present invention is to provide a light-sensitive composition which makes it possible to provide PS plates or the like having high quality and which has appropriate developability with both developers containing organic substances such as organic solvents and/or surfactants and those substantially free of such organic substances.

Another object of the present invention is to provide a light-sensitive composition capable of providing lithographic printing plates which do not cause any background contamination during printing at all.

The inventors of this invention have conducted various studies to achieve the foregoing objects, have found that these objects can effectively be achieved by use of a photocross-linkable polymeric compound excellent in solubility in an aqueous alkali solution and thus have completed the present invention.

According to the present invention, there is provided a light-sensitive composition which comprises a polymeric compound having both photocross-linkable groups and functional groups carrying P—OH bonds.

DETAILED EXPLANATION OF THE INVENTION

The light-sensitive composition of the present invention will hereunder be explained in more detail.

The term "functional groups carrying P—OH bonds" herein used means an oxoacid residue of phosphorus atom which may be in the form of a salt with an alkali metal, alkaline earth metal or ammonium ion. The functional groups carrying P—OH groups suitably used in the present invention are those represented by the following general formula (I):

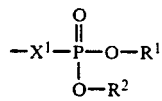

In formula (I), $X^1$ represents a single bond, oxygen atom, sulfur atom or a group $NR^3$; and $R^1$, $R^2$ and $R^3$ each independently represents a hydrogen atom or a substituted or unsubstituted $C_1$ to $C_{20}$ alkyl, $C_3$ to $C_{20}$ cycloalkyl, $C_6$ to $C_{20}$ aryl or $C_7$ to $C_{20}$ aralkyl group, provided that at least one of $R^1$ and $R^2$ represents a hydrogen atom and preferably both of them are hydrogen atoms.

The polymeric compounds having both photocross-linkable groups and functional groups including P—OH groups which may be suitably employed in the present invention can be prepared by polymerizing low molecular weight compounds each having at least one polymerizable unsaturated bond and at least one photocross-linkable group with low molecular weight compounds each having at least one photocross-linkable group and at least one functional group carrying P—OH groups in the presence of a known polymerization initiator in a proper solvent. Alternatively, it is also possible to synthesize polymeric compounds from low molecular weight compounds having at least one polymerizable unsaturated bond and at least one functional group carrying P—OH groups which are protected with proper protective groups, the protective groups being subsequently eliminated after the polymerization.

Moreover, photocross-linkable groups and functional groups carrying P—OH groups can be introduced into polymeric compounds having appropriate functional groups such as polyvinyl alcohol through a polymer reaction. Preferred is a method for obtaining the desired polymeric compounds which comprises polymerizing low molecular weight compounds each having at least one polymerizable unsaturated bond and at least one photocross-linkable group with low molecular weight compounds each having at least one photocross-linkable group and at least one functional group carrying P—OH groups in the presence of a known polymerization initiator in a proper solvent, since the amount of the photocross-linkable groups and that of the functional groups carrying P—OH group to be incorporated can easily be controlled.

Examples of the low molecular weight compounds having at least one polymerizable unsaturated bond and at least one photocross-linkable group are those disclosed in, for instance, J.P. KOKOKU Nos. Sho 49-28122 (U.S. Pat. No. 4,297,470), Sho 55-12042 and Sho 51-37673 and J.P. KOKAI Nos. Sho 50-24384, Sho 62-284350, Sho 51-125474 and Sho 52-988 (U.S. Pat. No. 4,079,041).

Among these, preferably used in the present invention are those represented by the following general formula (II) or (III):

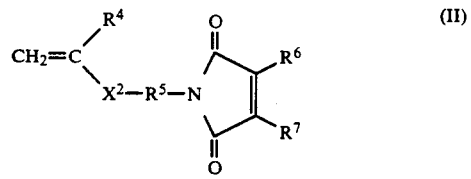

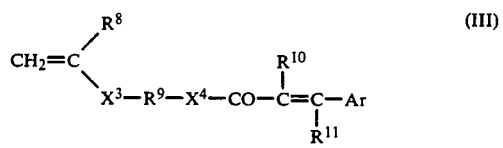

wherein $R^4$ and $R^8$ each independently represents a hydrogen atom or a methyl group; $R^5$ and $R^9$ each independently represents a bivalent coupling group comprising at least two kinds of atoms selected from the group consisting of C, H, N, O and S; $R^6$ and $R^7$ each independently represents a hydrogen atom, a halogen atom, preferably a chlorine, bromine or iodine atom or an alkyl group, preferably a $C_1$ to $C_4$ lower alkyl group, particularly a methyl group, provided that $R^6$ and $R^7$ may be bonded together to form a 5- or 6-membered ring; $R^{10}$ and $R^{11}$ each independently represents H, CN, $NO_2$, a halogen atom or a $C_1$ to $C_6$ alkyl group; $X^2$ and $X^3$ each independently represents a single bond —COO— or —CONH—; $X^4$ represents O or NH; Ar represents an aromatic group which may be substituted or a hetero aromatic group, preferably a substituted or unsubstituted phenyl group.

Specific examples of the low molecular weight compound of formula (II) include those represented by the following general formulae:

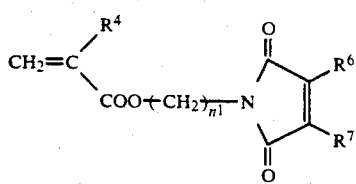
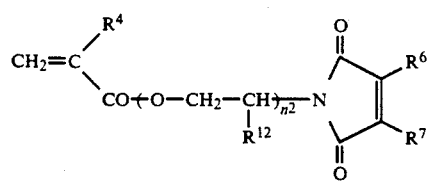

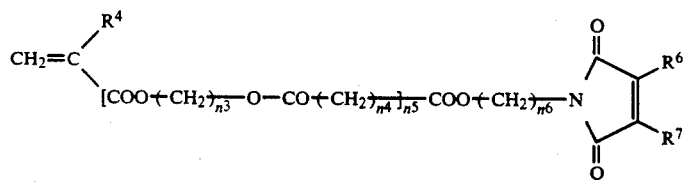

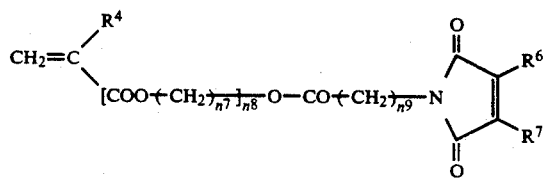

wherein $R^4$, $R^6$ and $R^7$ have the same meanings as those defined above; $n^1$ and $n^9$ each independently represents an integer, preferably an integer ranging from 1 to 12; and $R^{12}$ represents a hydrogen atom or a methyl group.

Specific examples of the low molecular weight compound of formula (III) are those represented by the following general formulae:

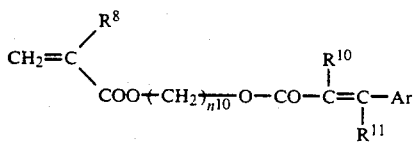
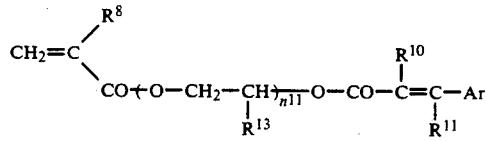

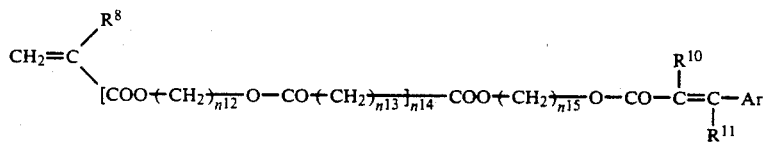

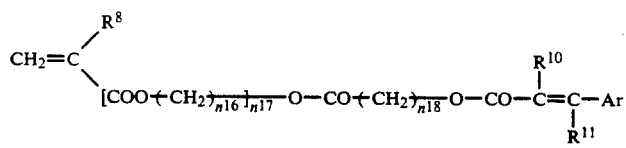

wherein $R^8$, $R^{10}$, $R^{11}$ and AR are the same as those defined above; $n^{10}$ to $n^{18}$ each represents an integer, preferably an integer ranging from 1 to 12; and $R^{13}$ represents a hydrogen atom or a methyl group.

In addition, as the low molecular weight compounds having at least one polymerizable unsaturated group and at least one functional group carrying P—OH groups, there may be mentioned, for instance, those disclosed in, for instance, Polym. Paint Colour J., 1987, 177, p. 4193, J.P. KOKAI Nos. Sho 59-139392, Sho 51-44152 and Sho 53-113843, J.P. KOKOKU No. Sho 57-49557, European Patent Nos. 88527A2, 115410A2, 301101A1 and 74708A2 and U.S. Pat. Nos. 4,259,075, 4,259,117, 4,368,043 and 4,222,780.

Low molecular weight compounds which can be particularly preferably used in the present invention are those represented by the following general formula (IV):

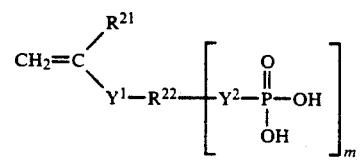

wherein m is 1 or 2; $R^{21}$ represents a hydrogen atom or a methyl group; $R^{22}$ represents a single bond or a coupling group consisting of at least two kinds of atoms selected from the group consisting of C, H, N, O and S, $R^{22}$ being a bivalent group when m is equal to 1 or a trivalent group when m equals to 2; $Y^1$ represents a single bond or a group —COO— or —CONH—; and $Y^2$ represents a single bond, O, NH or S.

The compounds represented by the general formula (IV) are, for instance, those listed below:

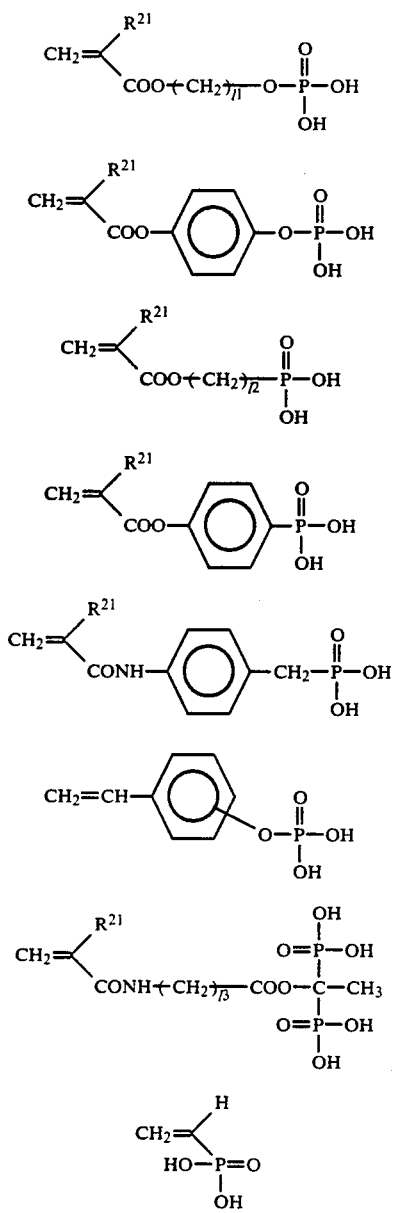

wherein $R^{21}$ is the same as that defined above; and $l^1$ to $l^3$ each independently represents an integer, preferably an integer ranging from 1 to 12.

The polymeric compounds having photocross-linkable groups and functional groups carrying P—OH groups preferably used in the present invention are copolymers of at least one compound represented by the general formula (II) or (III) and at least one compound represented by the general formula (IV), but may be multicomponent copolymers of these compounds and at least one other polymerizable low molecular weight compound.

Examples of such other polymerizable low molecular weight compounds are acrylic acid, methacrylic acid, acrylonitrile, methacrylonitrile, acrylates, methacrylates, acrylamides, methacrylamides, allyl compounds, vinyl ethers, vinyl esters, styrenes and crotonic acid esters.

The polymeric compounds are prepared through polymerization reaction in a proper solvent. Examples of the solvents used in the polymerization are ethylene dichloride, cyclohexanone, methyl ethyl ketone, acetone, methanol, ethanol, ethylene glycol monomethyl ether, ethylene glycol monoethyl ether, 2-methoxyethyl acetate, 1-methoxy-2-propanol, 1-methoxy-2-propyl acetate, N,N-dimethylformamide, N,N-dimethylacetamide, toluene, ethyl acetate, methyl lactate, ethyl lactate and dimethylsulfoxide. These solvents may be used alone or in combination.

The polymeric compounds used in the present invention have 2 or more photocross-linkable groups on the side chains per molecule on the average and the weight average molecular weight thereof is preferably not less than 1,000 and more preferably ranges from 2,000 to 300,000. Moreover, the number average molecular weight thereof is preferably not less than 800 and more preferably ranges from 1,000 to 250,000. The polydispersity index (weight average molecular weight/number average molecular weight) of the polymeric compound is preferably not less than 1 and more preferably ranges from 1.1 to 10.

The polymeric compounds used in the present invention may comprise unreacted low molecular weight compounds. In such a case, the amount of the unreacted low molecular weight compounds is desirably not more than 15% by weight based on the total weight of the polymeric compound.

The polymeric compound used in the invention comprises the repeating units of copolymerizable components having photocross-linkable groups in an amount of preferably not less than 20 mole % and more preferably 30 to 90 mole %. On the other hand, it comprises the repeating units of copolymerizable components having functional groups carrying P—OH groups in an amount of preferably not less than 5 mole % and more preferably 10 to 70 mole %. If the amount of the copolymerizable component having functional groups carrying P—OH groups is extremely small, the solubility of the polymer in an aqueous alkali solution becomes insufficient, while if it is extremely great, the sensitivity of the resulting light-sensitive layer is lowered and the strength of image areas of the lithographic printing plate finally obtained is impaired. The polymeric compounds used in the present invention may be random copolymers or block copolymers obtained by copolymerizing the foregoing monomers, but are preferably random copolymers.

Moreover, in the present invention, it is also possible to employ, as the polymeric compound having both photocross-linkable groups and functional groups carrying P—OH bonds, high molecular weight compounds polymerized through ester bonds, amido bonds, urethane bonds, carbonate bonds, imido bonds and any combination thereof, in addition to the foregoing polymers. Among these, preferably used in the invention are polymerized through ester bonds.

These polyesters favorably employed in the present invention are those formed by polymerizing, through ether bonds, low molecular weight compounds having both at least one photocross-linkable group and at least two carboxylic acid chlorides moieties, carboxyl groups or carboxylate groups with low molecular weight compounds having at least one functional group carrying P—OH bonds and at least two hydroxyl groups in a known manner for forming polyesters.

In the preparation of such polyesters, first the functional groups having P—OH bonds may be protected with appropriate protective groups during forming polyesters and then the protective groups may be removed to obtain desired polyesters. According to such methods, it is also possible to introduce photocross-linkable groups in the main chains of the resulting polyesters.

The polymeric compounds may be used alone or in combination and the content of the polymeric compounds in the light-sensitive composition ranges from 10 to 99% by weight, preferably 50 to 95% by weight based on the weight of the composition.

The light-sensitive composition of the present invention may optionally comprises sensitizers. The sensitizers are preferably triplet sensitizers which show a maximum absorption at a wavelength of not less than 300 nm so as to practically absorb sufficient quantity of light.

Specific examples thereof are benzophenone derivatives, benzanthrone derivatives, quinones, aromatic nitro compounds, naphthothiazoline derivatives, benzothiazoline derivatives, thioxanthones, naphthothiazole derivatives, ketocoumarin derivatives, benzothiazole derivatives, naphthofuranone compounds, pyrylium salts and thiapyrylium salts. More specifically, there may be mentioned, for instance, Michler's ketones, N,N'-diethylaminobenzophenone, benzanthrone, (3-methyl-1,3-diaza-1,9-benz)anthrone picramide, 5-nitroacenaphthene, 2-chlorothioxanthone, 2-isopropylthioxanthone, dimethylthioxanthone, methylthioxanthone-1-ethylcarboxylate, 2-nitrofluorene, 2-dibenzoylmethylene-3-methylnaphthothiazoline, 3,3-carbonylbis(7-diethylaminocoumarin), 2,4,6-triphenyl thiapyrylium perchlorate and 2-(p-chlorobenzoyl)naphthothiazole.

The amount of these sensitizers ranges from about 1 to about 20% by weight, preferably 3 to 10% by weight based on the total weight of the light-sensitive composition.

In addition to the foregoing components, the light-sensitive composition of the present invention may optionally comprise negative working diazo resins. Examples of such diazo resins are reaction products of anions with condensates obtained by condensing diazo monomers with condensing agents such as formaldehyde, acetaldehyde, propionaldehyde, butylaldehyde, isobutylaldehyde and/or benzaldehyde in a molar ratio ranging from 1:1 to 1:0.5, preferably 1:0.8 to 1:0.6 in the usual condensation methods. Specific examples of the diazo monomers are 4-diazo-diphenylamine, 1-diazo-4-N,N-dimethylamino-benzene, 1-diazo-4-N,N-diethylaminobenzene, 1-diazo-4-N-ethyl-N-hydroxyethylamino-benzene, 1-diazo-4-N-methyl-N-hydroxyethylaminobenzene, 1-diazo-2,5-diethoxy-4-benzoylaminobenzene, 1-diazo-4-N-benzylaminobenzene, 1-diazo-4-N,N-dimethylaminobenzene, 1-diazo-4-morpholinobenzene, 1-diazo-2,5-dimethoxy-4-p-tolylmercaptobenzene, 1-diazo-2-ethoxy-4-N,N-dimethylaminobenzene, p-diazo-dimethylaniline, 1-diazo-2,5-dibutoxy-4-morpholinobenzene, 1-diazo-2,5-diethoxy-4-morpholinobenzene, 1-diazo-2,5-dimethoxy-4-morpholinobenzene, 1-diazo-2,5-diethoxy-4-p-tolylmercaptobenzene, 1-diazo-3-ethoxy-4-N-methyl-N-benzylaminobenzene, 1-diazo-3-chloro-4-N,N-diethylaminobenzene, 1-diazo-3-methyl-4-pyrrolidinobenzene, 1-diazo-2-chloro-4-N,N-dimethylamino-5-methoxybenzene, 1-diazo-3-methoxy-4-pyrrolidino benzene, 3-methoxy-4-diazodiphenylamine, 3-ethoxy-4-diazodiphenylamine, 3-(n-propoxy)-4-diazodiphenylamine and 3-isopropoxy-4-diazo-diphenylamine.

Moreover, specific examples of the anions are tetrafluoroboric acid residue, hexafluorophosphoric acid residue, triisopropyl napththalene sulfonate residue, 5-nitro-o-toluenesulfonate residue, 5-sulfosalicylic acid, 2,5-dimethylbenzenesulfonic acid, 2,4,6-trimethylbenzenesulfonic acid, 2-nitrobenzenesulfonic acid, 3-chlorobenzenesulfonic acid, 3-bromobenzenesulfonic acid, 2-fluorocaprylnaphthalenesulfonic acid, dodecylbenzenesulfonic acid, 1-naphthol- 5-sulfonic acid, 2-methoxy-4-hydroxy-5-benzoylbenzenesulfonic acid and p-toluenesulfonic acid. Among these, preferred are hexafluorophosphoric acid and alkylaromatic sulfonic acids such as triisopropylnaphthalenesulfonic acid and 2,5-dimethylbenzenesulfonic acid.

These diazo resins may be used alone or in combination and the amount thereof preferably ranges from 0.1 to 15% by weight, more preferably 0.3 to 5% by weight based on the total weight of the light-sensitive composition.

The light-sensitive composition of the invention may further comprise, in addition to the polymeric compounds explained above, at least one other known alkali-soluble polymeric compounds selected from the group consisting of phenol-formaldehyde resins, cresol-formaldehyde resins, xylene resins modified with phenol, polyhydroxy styrenes and halogenated polyhydroxy styrenes. These other polymeric compounds may be used in the composition in an amount of not more than 70% weight on the basis of the total weight of the composition.

It is desirable that at least one heat polymerization inhibitor be added to the light-sensitive composition of the present invention and examples of such heat polymerization inhibitors are hydroquinone, p-methoxyphenol, di-t-butyl-p-cresol, pyrogallol, t-butylcatechol, benzoquinone, 4,4'-thiobis (3-methyl-6-t-butylphenol), 2,2'-methylenebis(4-methyl-6-t-butylphenol) and 2-mercaptobenzimidazole. Moreover, the composition may also comprise dyes or pigments for the purpose of coloring of the light-sensitive layer and/or pH indicators as agents or compositions for obtaining a visible image immediately after imgewise exposure. Typical examples of the printing out agents include a combination of a light-sensitive compound which releases an acid through exposure to light and an organic dye capable of forming a salt with the light-sensitive compound.

Further, the composition may optionally comprise, as stabilizers for the diazo resins, phosphoric acid, phosphorous acid, tartaric acid, citric acid, malic acid, dipicolinic acid, polynucleic aromatic sulfonic acids and salts thereof and sulfosalicylic acid.

The composition may further comprise other additives such as plasticizers. Examples of the plasticizers usable in the invention are phthalic acid dialkyl esters such as dibutyl phthalate and dihexyl phthalate, oligoethylene glycol alkyl esters and phosphoric acid ester type plasticizers.

To prepare the PS plates or the like, the light-sensitive composition explained above is first dissolved in a proper solvent selected from the group consisting of 2-methoxyethanol, 2-methoxyethyl acetate, propylene glycol monomethyl ether, 3-methoxypropanol, 3-methoxypropyl acetate, methyl ethyl ketone, N,N-dimethylformamide, N,N-dimethylacetamide, dimethylsulfoxide, ethylene dichloride and combination thereof and then applied to the surface of a substrate. The coated amount thereof suitably ranges from about 0.1 to about 10 g/m$^2$ and more preferably 0.5 to 5 g/m$^2$.

When the composition of the invention is used for making PS plates, aluminum plates are preferably used as substrates therefor. Such aluminum plates include a pure aluminum plate and aluminum alloy plates. Examples of aluminum alloys are those of aluminum and silicon, copper, manganese, magnesium, chromium, zinc, lead, bismuth and/or nickel. These alloys may further comprise certain amounts of iron and titanium as well as trace amount of other impurities.

The aluminum plate is optionally subjected to various surface treatments. For instance, the aluminum plate is preferably subjected to surface treatments such as graining, dipping in an aqueous solution of sodium silicate, potassium fluorozirconate or a phosphoric acid salt or anodization. In addition, it is also possible to use an aluminum plate which is grained and then dipped in an aqueous sodium silicate solution as disclosed in U.S. Pat. No. 2,714,066; and an aluminum plate which is anodized and then dipped in an aqueous alkali metal silicate solution as disclosed in U.S. Pat. No. 3,181,461. The aforementioned anodization is preferably performed by passing an electric current through the aluminum plate serving as an anode in an electrolyte selected from the group consisting of aqueous and/or non-aqueous solutions of inorganic acid such as phosphoric acid, chromic acid, sulfuric acid and boric acid, organic acids such as oxalic acid and sulfamic acid or salts thereof.

In addition, silicate electrodeposition as disclosed in U.S. Pat. No. 3,658,662 is also effectively employed in the present invention.

These hydrophilization treatments are performed not only for making the surface of a substrate hydrophilic, but also for preventing any detrimental reaction with a light-sensitive layer applied thereon and for enhancing the adhesion to the light-sensitive layer.

If necessary, the aluminum plate may be subjected to pretreatments such as removal of rolling oil from the surface of the plate and that for exposing clear aluminum surface. Solvents such as trichloroethylene and surfactants or the like are employed to degrease the surface. On the other hand, the exposure of the clean aluminum surface has widely been performed by methods in which an alkaline etching agent such as sodium hydroxide and potassium hydroxide is used.

The graining may be either of mechanical, chemical and electrochemical methods. Examples of such mechanical methods are ball graining, blast graining and brush graining in which the surface of an aluminum plate is rubbed with a nylon brush with an aqueous suspension of an abrasive such as pumice stone; such a chemical method preferably comprises immersing in a saturated aqueous solution of aluminum salt of a mineral acid as disclosed in J.P. KOKAI No. Sho 54-31187; and such an electrochemical method preferably comprises electrolyzing, by passing an alternating current through the plate, the surface in an acidic electrolyte such as hydrochloric acid, nitric acid or a combination thereof. Among these surface roughening treatments, preferred are those comprising electrolyzing by passing an alternating current through the plate. Particularly preferred is a method comprising a combination of a mechanical graining treatment and an electrochemical surface roughening treatment as disclosed in J.P. KOKAI No. Sho 55-137993 because it provides ink receiving images having high adhesion to the substrate.

The foregoing graining treatment is preferably performed so that the center line average height (Ra) of the surface of the aluminum plate is in the range of from 0.3 to $1.0\mu$.

The aluminum plate thus treated is optionally washed with water and chemically etched.

The etching solutions are usually selected from aqueous solutions of bases or acids which can dissolve aluminum. In this respect, it should be noted that the etching solution must not form a layer different from aluminum and derived from the components of the etching solution. Examples of preferred etching agents are basic materials such as sodium hydroxide, potassium hydroxide, trisodium phosphate, disodium hydrogen phosphate, tripotassium phosphate and dipotassium hydrogen phosphate; and acidic materials such as sulfuric acid, persulfuric acid, phosphoric acid, hydrochloric acid and salts thereof, but it is not preferred to use salts with a metal which has ionization tendency lower than aluminum such as zinc, chromium, cobalt, nickel and copper because they form an undesirable film on the etched surface.

The etching treatment is most preferably performed at a concentration of the etching agent and a temperature which are selected so that the rate of dissolution of aluminum or an alloy thereof is controlled to 0.3 to 40 $g/m^2$ per minute of the dipping time, but this is not critical in the present invention.

The etching is carried out by immersing an aluminum plate in the foregoing etching solution or by applying the etching solution to the surface of the aluminum plate and preferably performed so that the amount of the aluminum removed by etching is 0.5 to 10 $g/m^2$.

As the etching agent, preferred are aqueous solutions of bases since they show high etching velocity. In this case, smut is usually formed and, therefore, the aluminum plate is desmutted after the etching treatment. In this desmut treatment, there is used an acid such as nitric acid, sulfuric acid, phosphoric acid, chromic acid, hydrofluoric acid and borofluoric acid.

The aluminum plate thus etched is, if necessary, washed with water and anodized. The anodization may be performed in the manner commonly employed in this field. More specifically, a direct current or an alternating current is passed through the aluminum plate serving as an anode in an electrolyte comprising either an aqueous solution or a non-aqueous solution of sulfuric acid, phosphoric acid, chromic acid, oxalic acid, sulfamic acid, benzenesulfonic acid or any combination thereof to form an anodized layer on the surface of the aluminum substrate.

The conditions for anodization vary depending on the kinds of the electrolytes used, but are in general an electrolyte concentration of 1 to 80% by weight; a temperature of the electrolyte ranging from 5° to 70° C.; a current density of 0.5 to 60 $A/dm^2$; an electric voltage of 1 to 100 V; and a time for electrolysis of 30 seconds to 50 minutes.

Among these methods for anodization, preferred are those disclosed in U.K. Patent No. 4,412,768 which comprise anodizing at a high current density in a sulfuric acid solution; and those disclosed in U.S. Pat. No. 3,511,661 which comprise anodizing in an electrolyte consisting of a phosphoric acid solution.

The aluminum plate which has been surface-roughened and then anodized is, if necessary, subjected to hydrophilization treatment. Examples of preferred hydrophilization treatments are those comprising dipping the plate in an aqueous solution of an alkali metal silicate such as sodium silicate as disclosed in U.S. Pat. Nos.

2,714,066 and 3,181,461; those comprising dipping the plate in a solution of potassium fluorozirconate as disclosed in J.P. KOKOKU No. Sho 36-22063; and those comprising treating the plate with polyvinyl sulfonic acid as disclosed in U.S. Pat. No. 4,153,461.

In addition to the aluminum substrates described above, also preferred are those having an underlying coating of a water-soluble resin such as polyacrylic acid, polymers or copolymers having sulfonic acid residues on the side chains or other alkaline aqueous solution-soluble low molecular weight compounds such as salts of triethanolamine or an alanine compound after subjecting it to the foregoing treatment.

The light-sensitive composition of the present invention applied onto the surface of a substrate is exposed to light through an original transparency carrying line and half-tone dot images and then developed with an aqueous alkaline developer to thus give relief images which are negative with respect to the original.

As light sources which may be used in imagewise exposure of the light-sensitive materials; there may be mentioned, for instance, a carbon arc lamp, a mercury lamp, a xenon lamp, a metal halide lamp, a strobo, an ultraviolet ray-generator and a laser oscillator.

After the light-sensitive composition of the present invention is coated, dried and imagewise exposed to light, it shows excellent practically acceptable developability with either of an aqueous alkali developer and aqueous alkaline solutions containing or free of organic substances such as organic solvents and/or surfacants.

Moreover, when it is used to form PS plates, the resulting lithographic printing plates never cause background contamination and can provide a large number of good printed matters.

Therefore, the composition of the invention makes it possible to develop negative working PS plates with developers for positive working PS plates. This means that when both positive and negative working PS plates are processed, the use of the composition of this invention can save troubles such as the preparation of developer compositions adapted to respective plates; substitution of developers and previous preparation of two kinds of developer compositions and developing machines, this leads to substantial improvement in operation efficiency and substantial reduction in cost of equipment and space for installing the equipments.

The present invention will hereunder be explained in more detail with reference to the following non-limitative working Examples and the effects practically achieved by the invention will also be discussed in detail in comparison with Comparative Examples.

EXAMPLE

Polymeric compounds (a) to (c) which fulfill the requirements of the present invention (hereunder referred to as "polymeric compounds (a) to (c) of the invention") and those (d) and (e) as comparative samples as listed in Table I given below were prepared according to the method disclosed in J.P. KOKAI No. Sho 52-988 and J.P. KOKOKU No. Sho 49-28122.

TABLE I

| Polymeric Compound | Structural Units or Repeating Units | Molar Ratio |
|---|---|---|
| (a) | 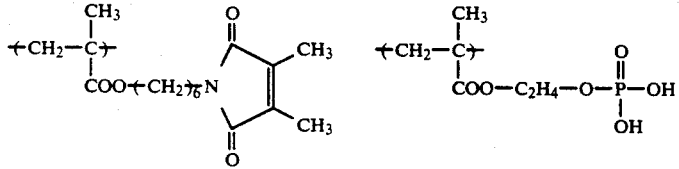 | 70/30 |
| (b) | 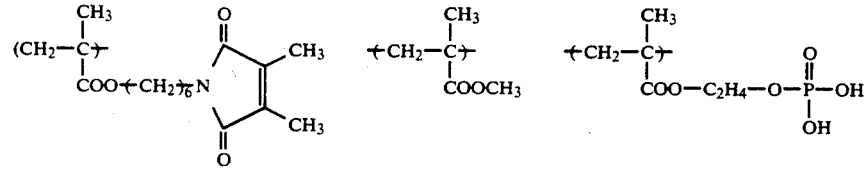 | 65/10/25 |
| (c) | 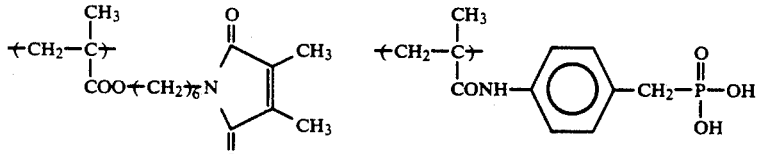 | 64/35 |
| (d) | 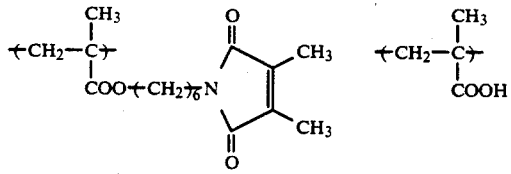 | 70/30 |
| (e) | 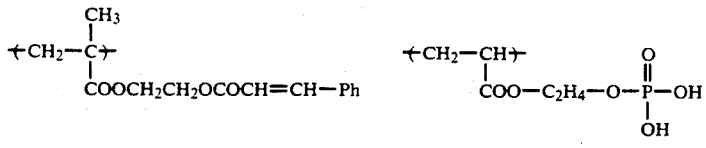 | 70/30 |

TABLE I-continued

| Polymeric Compound | Structural Units or Repeating Units | Molar Ratio |
|---|---|---|
| (f) | $-(CH_2-C(CH_3)(COOCH_2CH_2OCOCH=CH-Ph))-$     $-(CH_2-CH(COOH))-$ | 70/30 |

The surface of an aluminum plate having a thickness of 0.30 mm was grained with a nylon brush and a suspension of 400 mesh pumice stone and then washed with water sufficiently. The plate was immersed in a 10% sodium hydroxide solution maintained at 70° C. for 60 seconds to perform etching of the surface, washed with running water, neutralized and washed with a 20% nitric acid solution and then washed with water. Thereafter, the aluminum plate was subjected to an electrolytic surface-roughening treatment by the use of sinusoidal alternating waved current in a 1% aqueous nitric acid solution, the conditions for the treatment being Va of 12.7 V; and the quantity of anode time electricity of 160 coulomb/dm². The surface roughness thereof was found to be 0.6 μ (expressed in terms of Ra unit). Subsequently, the plate was immersed in a 30% aqueous solution of sulfuric acid at 55° C. for 2 minutes to desmut the plate, then anodized in a 20% aqueous sulfuric acid solution at a current density of 2 A/dm² so that the amount of the resulting layer formed due to the anodization was 2.7 g/m².

Solutions of light-sensitive compositions (hereunder referred to as "light-sensitive solutions") (A)-1 to (A)-3 which will be explained below were applied to the surface of the aluminum plate thus treated with a whirler and dried at 80° C. for 2 minutes. The amount of the solutions coated was 1.5 g/m² (determined after drying).

The polymeric compounds used in the light-sensitive solutions (A)-1 to (A)-3 are shown in the following Table I.

| Light-sensitive Solution (A) | |
|---|---|
| Component | Amount (g) |
| Polymeric compound of the invention (see Table II) | 5 |
| Sensitizer represented by the following formula: | 0.25 |
| Propylene glycol monomethyl ether | 50 |
| Methyl ethyl ketone | 50 |
| Megafac F-177 (Fluorine atom-containing nonionic surfactant available from DAINIPPON INK AND CHEMICALS, INC.) | 0.03 |
| 10% Cu-phthalocyanine pigment (CI Pigment Blue 15) dispersion in a plasticizer | 1.0 |

Then a light-sensitive solution (B), which was the same as the solution (A) except that the comparative polymeric compound (d) was substituted for the polymeric compound of the invention, was likewise applied to the same aluminum plate and dried.

Moreover, a light-sensitive solution (C) having the following composition was likewise applied to the same aluminum plate and then dried.

| Light-sensitive Solution (C) | |
|---|---|
| Component | Amount (g) |
| Polymeric compound (e) of the invention (see Table II) | 5.0 |
| Sensitizer represented by the following formula: | 0.4 |
| Diethyl phthalate | 0.5 |
| 10% Cu-phthalocyanine pigment (CI Pigment Blue 15) dispersion in a plasticizer | 1.0 |
| Megafac F-177 (Fluorine atom-containing nonionic surfactant available from DAINIPPON INK AND CHEMICALS, INC.) | 0.02 |
| Methyl ethyl ketone | 20 |
| Methanol | 2 |
| Propylene glycol monomethyl ether | 28 |

A light-sensitive solution (D), which was the same as the light-sensitive solution (C) except that the comparative polymeric compound (f) was substituted for the polymeric compound (e) of the invention, was likewise applied to the same aluminum plate and dried.

Each of the PS plates (A)-1 to (A)-3, (B), (C) and (D) obtained by using the corresponding light-sensitive solutions (A)-1 to (A)-3, (B), (C) and (D) was imagewise exposed to light from a PS Light available from Fuji Photo Co., Ltd. for one minute at a distance of 1 m, then immersed in the following developer at room temperature for one minute and the surface thereof was lightly rubbed with absorbent wadding.

| Developer | |
|---|---|
| Component | Amount (g) |
| Sodium silicate having a molar ratio, SiO₂/Na₂O, of about 1.1 | 20 |
| Water | 1000 |

Each lithographic printing plate thus obtained was mounted to a GTO type printing press available from Heiderberg Co., Ltd. and printing operation was performed with the use of a commercially available ink and wood-free paper.

At this stage, there was visually evaluated the contamination appearing on non-image areas of the printed matters according to the following three stage-evaluation-standard:

○: not contaminated at all
Δ: slightly contaminated
x: severely contaminated.

The results observed are summarized in Table II given below.

TABLE II

| Printing Plate | Polymeric Compound Used | Contamination of Non-image Areas |
|---|---|---|
| (A)-1 | (a) | ○ |
| (A)-2 | (b) | ○ |
| (A)-3 | (c) | ○ |
| (B) | (d) | △ |
| (C) | (e) | ○ |
| (D) | (f) | X |

As seen from the results listed in Table II, all of the lithographic printing plates (A)-1 to (A)-3 and (C) which were obtained by using the polymeric compounds of the present invention did not cause contamination of the non-image areas, while the printing plates (B) and (D) which was obtained by using comparative polymeric compounds caused contamination of the non-image areas of the printed matters, i.e., background contamination.

What is claimed is:

1. A light-sensitive composition comprising at least one photosensitive polymeric compound having both photocross-linkable groups capable of undergoing cycloaddition reaction upon exposure to light, and functional groups carrying P—OH bonds, said composition having improved developability with an aqueous alkaline developer, wherein the polymeric compound is selected from the group consisting of those compounds prepared by polymerizing low molecular weight compounds each having at least one polymerizable unsaturated bond and at least one photocross-linkable group with low molecular weight compounds each having at least one polymerizable unsaturated bond and at least one functional group carrying P—OH groups where the polymerization occurs in the presence of a polymerization initiator in a proper solvent, and further wherein the low molecular weight compounds each having at least one polymerizable unsaturated bond and at least one photocross-linkable group are selected from the group consisting of those represented by the following general formula (II) or (III)

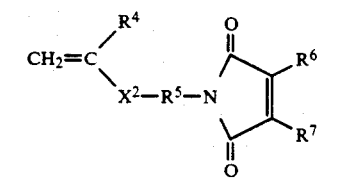

(II)

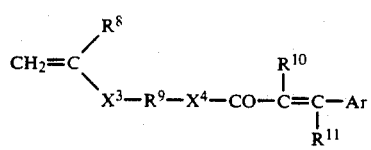

(III)

wherein $R^4$ and $R^8$ each independently represents a hydrogen atom or a methyl group; $R^5$ and $R^9$ each independently represents a bivalent coupling group comprising at least two kinds of atoms selected from the group consisting of C, H, N, O and S; $R^6$ and $R^7$ each independently represents a hydrogen atom, a halogen atom or an alkyl group provided that they may be bonded together to form a 5- or 6-membered ring; $R^{10}$ and $R^{11}$ each independently represents H, CN, $NO_2$, a halogen atom or a $C_1$ to a $C_6$ alkyl group; $X^2$ and $X^3$ each independently represents a single bond, —COO— or —CONH—; $X^4$ represents O or NH; Ar represents an aromatic group which may be substituted or a hetero aromatic group.

2. The light-sensitive composition of claim 1 wherein the functional group carrying P—OH bonds is an oxoacid residue of phosphorus atom which may be in the form of a salt with an alkali metal, alkaline earth metal or ammonium ion and is selected from the group consisting of those represented by the following general formula (I):

(I)

wherein $X^1$ represents a single bond, oxygen atom, sulfur atom or a group $NR^3$; and $R^1$, $R^2$ and $R^3$ each independently represents a hydrogen atom or a substituted or unsubstituted $C_1$ to $C_{20}$ alkyl, $C_3$ to $C_{20}$ cycloalkyl, $C_6$ to $C_{20}$ aryl or $C_7$ to $C_{20}$ aralkyl group, provided that at least one of $R^1$ and $R^2$ represents a hydrogen atom.

3. The light-sensitive composition of claim 1 wherein the polymeric compound having both photocross-linkable groups and functional groups carrying P—OH groups is selected from the group consisting of those obtained by introducing photocross-linkable groups and functional groups carrying P—OH groups into polymeric compounds having appropriate functional groups through a polymer reaction.

4. The light-sensitive composition of claim 1 wherein in the general formulas (II) and (III), $R^4$ and $R^8$ each independently represents a hydrogen atom or a methyl group; $R^5$ and $R^9$ each independently represents a bivalent coupling group comprising at least two kinds of atoms selected from the group consisting of C, H, N, O and S; $R^6$ and $R^7$ each independently represents a hydrogen atom, a chlorine, bromine or iodine atom or a $C_1$ to $C_4$ lower alkyl group, provided that $R^6$ and $R^7$ may be bonded together to form a 5- or 6-membered ring; $R^{10}$ and $R^{11}$ each independently represents H, CN, $NO_2$, a halogen atom or a $C_1$ to a $C_6$ alkyl group; $X^2$ and $X^3$ each independently represents a single bond, —COO— or —CONH—; $X^4$ represents O or NH; Ar represents a substituted or unsubstituted phenyl group.

5. The light-sensitive composition of claim 1 wherein the low molecular weight compound of formula (II) is selected from the group consisting of those represented by the following general formulae:

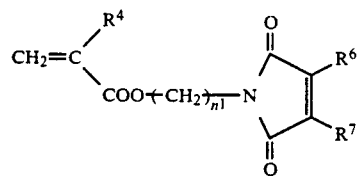
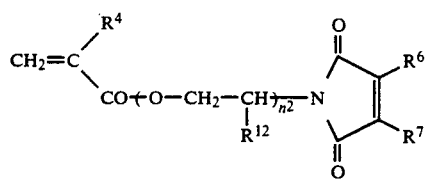
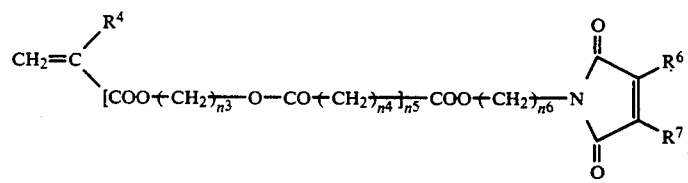
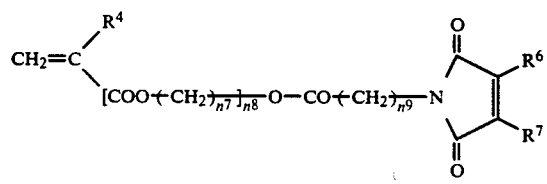

wherein $R^4$, $R^6$ and $R^7$ have the same meanings as those defined above; $n^1$ to $n^9$ each independently represents an integer ranging from 1 to 12; and $R^{12}$ represents a hydrogen atom or a methyl group.

6. The light-sensitive composition of claim 1 wherein the low molecular weight compound of formula (III) is selected from the group consisting of those represented by the following general formulae:

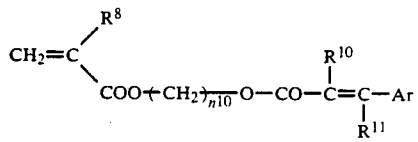
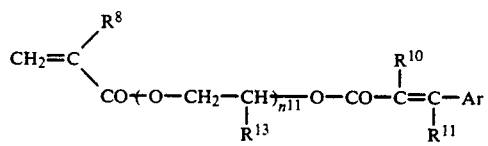
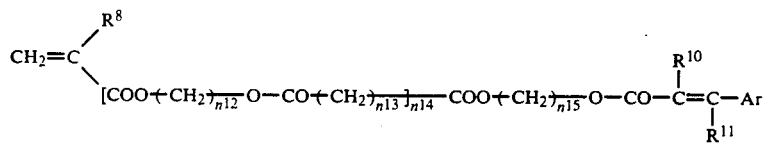
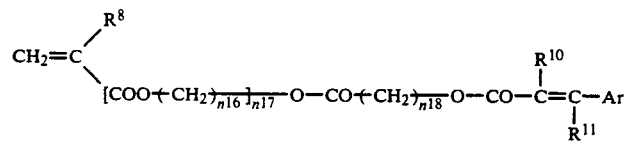

wherein $R^8$, $R^{10}$, $R^{11}$ and Ar are the same as those defined above; $n^{10}$ to $n^{18}$ each represents an integer ranging from 1 to 12; and $R^{13}$ represents a hydrogen atom or a methyl group.

7. The light-sensitive composition of claim 1 wherein the low molecular weight compounds each having at least one polymerizable unsaturated bond and at least one functional group carrying P—OH groups are selected from the group consisting of those represented by the following general formula (IV):

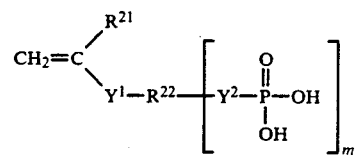

wherein m is 1 or 2; $R^{21}$ represents a hydrogen atom or a methyl group; $R^{22}$ represents a single bond or a coupling group consisting of at least two kinds of atoms selected from the group consisting of C, H, N, O and S, $R^{22}$ being a bivalent group when m is equal to 1 or a trivalent group when m equals to 2; $Y^1$ represents a single bond or a group —COO— or —CONH—; and $Y^2$ represents a single bond, O, NH or S.

8. The light-sensitive composition of claim 7 wherein the compound represented by the general formula (IV) is selected from the group consisting of those listed below:

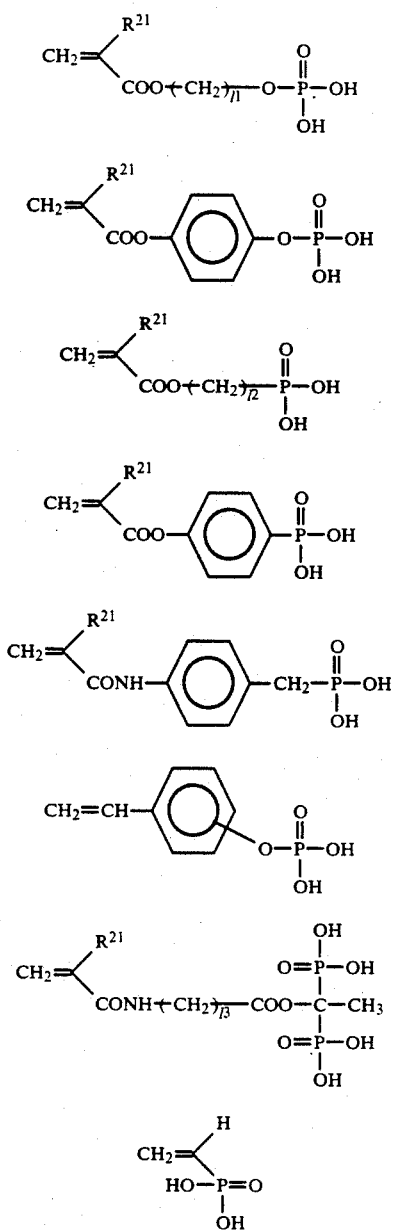

wherein $R^{21}$ is the same as that defined above; and $l^1$ to $l^3$ each independently represents an integer ranging from 1 to 12.

9. The light-sensitive composition of claim 7 wherein the polymeric compound having photocross-linkable groups and functional groups carrying P—OH groups is a multicomponent copolymer of at least one compound represented by the general formula (II) or (III); at least one compound represented by the general formula (IV) and at least one other polymerizable low molecular weight compound.

10. The light-sensitive composition of claim 9 wherein the polymerizable low molecular weight compound is selected from the group consisting of acrylic acid, methacrylic acid, acrylonitrile, methacrylonitrile, acrylates, methacrylates, acrylamides, methacrylamides, allyl compounds, vinyl ethers, vinyl esters, styrenes and crotonic acid esters.

11. The light-sensitive composition of claim 1 wherein the polymeric compound have 2 or more photocross-linkable groups on the side chains per molecule on the average; the weight average molecular weight thereof ranges from 2,000 to 300,000; the number average molecular weight thereof ranges from 1,000 to 250,000 and the polydispersity index of the polymeric compound is in the range of from 1.1 to 10.

12. The light-sensitive composition of claim 1 further comprising unreacted low molecular weight compounds in an amount of not more than 15% by weight based on the total weight of the polymeric compound.

13. The light-sensitive composition of claim 1 wherein the polymeric compound comprises the repeating units of copolymerizable components having photocross-linkable groups in an amount ranging from 30 to 90 mole % and the repeating units of copolymerizable components having functional groups carrying P—OH groups in an amount ranging from 10 to 70 mole %.

14. The light-sensitive composition of claim 1 wherein the polymeric compound is selected from the group consisting of those polymerized through ester bonds, amide bonds, urethane bonds, carbonate bonds, imide bonds and any combination thereof.

15. The light-sensitive composition of claim 14 wherein the polymeric compound is a polyester selected from those formed by polymerizing, through ester bonds, low molecular weight compounds having both at least one photocross-linkable group and at least two carboxylic acid chlorides moieties, carboxyl groups or carboxylate groups with low molecular weight compounds having at least one functional group carrying P—OH bonds and at least two hydroxyl groups.

16. The light-sensitive composition of claim 1 wherein the content of the polymeric compound in the light-sensitive composition ranges from 10 to 99% by weight based on the total weight of the composition.

17. The light-sensitive composition of claim 1 wherein it further comprises triplet sensitizers which show a maximum absorption at a wavelength of not less than 300 nm, in an amount ranging from about 1 to about 20% by weight based on the total weight of the light-sensitive composition.

18. The light-sensitive composition of claim 1 wherein it further comprises negative working diazo resins, in an amount ranging from 0.1 to 1.5% by weight based on the total weight of the light-sensitive composition.

19. The light-sensitive composition of claim 1, wherein said photocross-linkable groups are maleimide groups, cinnamyl groups, cinnamylidene groups or chalcone groups.

* * * * *